(12) United States Patent
Zhang et al.

(10) Patent No.: US 12,163,019 B2
(45) Date of Patent: Dec. 10, 2024

(54) COMPOSITION, SUBSTRATE AND PREPARATION METHOD OF LIGHT REFLECTION LAYER

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Bing Zhang, Beijing (CN); Teng Zhang, Beijing (CN); Xiaolin Geng, Beijing (CN); Liang Gao, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 600 days.

(21) Appl. No.: 17/479,174

(22) Filed: Sep. 20, 2021

(65) Prior Publication Data
US 2022/0267588 A1    Aug. 25, 2022

(30) Foreign Application Priority Data
Feb. 25, 2021 (CN) .......................... 202110215331.7

(51) Int. Cl.
*C08L 63/00* (2006.01)
*C08J 5/18* (2006.01)
(Continued)

(52) U.S. Cl.
CPC ................. *C08L 63/00* (2013.01); *C08J 5/18* (2013.01); *C08K 3/22* (2013.01); *C08K 7/16* (2013.01);
(Continued)

(58) Field of Classification Search
CPC ............ C08L 63/00; C08K 2003/2241; C08K 2202/003
(Continued)

(56) References Cited

U.S. PATENT DOCUMENTS

2013/0011617 A1    1/2013  Tasaki et al.
2020/0095430 A1*   3/2020  Tasaki .................... C08G 77/04

FOREIGN PATENT DOCUMENTS

CN          106025053 A         10/2016

OTHER PUBLICATIONS

Fist Office Action dated Nov. 8, 2022 relating to CN Patent Application No. 202110215331.7.

* cited by examiner

*Primary Examiner* — Jerry L Brooks
(74) *Attorney, Agent, or Firm* — DINSMORE & SHOHL LLP

(57) ABSTRACT

The present disclosure relates to a composition, a substrate and a preparation method of a light reflection layer. The composition comprises: a matrix material and an additive, the matrix material including a solvent, reactant molecules and a material with reflection function dispersed in the solvent, wherein the reactant molecules is capable of undergoing cross-linking reaction under a first preset condition, and include monomer molecules and/or prepolymer molecules; the additive including a filler material that is in the form of powder or microspheres, capable of being dispersed in the matrix material, and filled between the crosslinking points of any adjacent reactant molecules to block the crosslinking reaction of some adjacent reactant molecules under the first preset condition.

12 Claims, 4 Drawing Sheets

(51) Int. Cl.
*C08K 3/22* (2006.01)
*C08K 7/16* (2006.01)
*G02B 5/26* (2006.01)
*H10K 50/856* (2023.01)

(52) U.S. Cl.
CPC ............ *G02B 5/26* (2013.01); *H10K 50/856* (2023.02); *C08J 2363/00* (2013.01); *C08K 2003/2241* (2013.01); *C08K 2201/003* (2013.01); *C08L 2203/16* (2013.01); *C08L 2312/00* (2013.01)

(58) Field of Classification Search
USPC ........................................................ 359/361
See application file for complete search history.

COMPOSITION, SUBSTRATE AND PREPARATION METHOD OF LIGHT REFLECTION LAYER

CROSS-REFERENCE TO RELATED APPLICATIONS

This application claims the benefit of priority to Chinese Patent Application No. 202110215331.7 filed on Feb. 25, 2021, the disclosure of which is hereby incorporated by reference in its entirety.

TECHNICAL FIELD

The present disclosure relates to a composition, a substrate and a preparation method of a light reflection layer.

BACKGROUND

Mini LED (Mini-Light-Emitting Diode) is a research hotspot in the display industry, and relevant product designs are emerging endlessly, such as small-size mobile phones, tablet vehicles, notebooks, TV, monitors and outdoor displays. Relevant applications of Mini LED are the major trend for the upgrading of display products in the future.

SUMMARY

The main object of this disclosure is to provide a composition, a substrate and a preparation method of a light reflection layer.

According to an aspect of the present disclosure, a composition is provided, comprising: a matrix material and an additive, the matrix material including a solvent, reactant molecules and a material with reflection function dispersed in the solvent, wherein the reactant molecules is capable of undergoing cross-linking reaction under a first preset condition, and include monomer molecules and/or prepolymer molecules; the additive including a filler material that is in the form of powder or microspheres, capable of being dispersed in the matrix material, and filled between the crosslinking points of any adjacent reactant molecules to block the crosslinking reaction of some adjacent reactant molecules under the first preset condition.

In some embodiments, the reactant molecule is selected from at least one of an acrylic resin monomer or an epoxy resin monomer.

In some embodiments, the reactant molecule is selected from an epoxy resin monomer.

In some embodiments, the material with reflection function is in the form of powder or microspheres, and the particle diameter of the filler material is smaller than the particle diameter of the material with reflection function.

In some embodiments, the particle diameter of the filler material is 0.5 μm~2 μm.

In some embodiments, the particle diameter of the material with reflection function is 4 μm~8 μm.

In some embodiments, the filler material is selected from a mixture of one or more materials selected from a group consisting of silicon dioxide, silicate, metal oxide, titanium dioxide, calcium carbonate, and cellulose.

In some embodiments, the mass ratio of the filler material in the composition is 0.1%~5%.

In some embodiments, given a determined mass percentage of the additive in the composition, the ratio of the mass of the filler material to the mass of other additive components in the additive than the filler material is greater than or equal to 1:1 and less than or equal to 1:1.

In some embodiments, the mass ratio of the additive in the composition is 1%~10%.

According to another aspect of the present disclosure, a preparation method of a light reflection layer is provided, comprising: uniformly mixing the matrix material and the filler material in the composition described above to obtain a mixed solution; by form a prefabricated film by forming the mixed liquid on a base substrate; under the first preset condition, forming a light reflection film by crosslinking reaction occurred between adjacent reactant molecules in the prefabricated film that are not blocked by the filler material; curing the light reflection film to form a light reflection layer.

In some embodiments, uniformly mixing the matrix material and the filler material in the composition comprises: stirring the matrix material and the filler material for a preset time under a second preset condition to mix the matrix material and the filler material uniformly, wherein the second preset condition is different from the first preset condition.

According to another aspect of the present disclosure, there is provided a substrate prepared by the preparation method of a light reflection layer described above.

In some embodiments, the substrate further comprises a plurality of light-emitting elements arranged at intervals on the base substrate of the substrate; the light reflection layer is formed between any two adjacent light-emitting elements.

In some embodiments, each light-emitting element comprises a light-emitting surface; the substrate further comprises a light conversion layer arranged over the base substrate and located on one side of the light-emitting surface; the light conversion layer is configured to receive light emitted from the light-emitting surface and emit light after performing wavelength conversion on the light emitted from the light-emitting surface, and the light-reflecting layer is configured to reflect the light emitted by the light conversion layer.

BRIEF DESCRIPTION OF THE DRAWINGS

In order to more clearly explain the technical solution of the present invention, a brief introduction will be given below for the drawings required to be used in the description of embodiments. It is obvious that, the drawings illustrated as follows are merely some of the embodiments of the present invention. For a person skilled in the art, he or she may also acquire other drawings according to such drawings on the premise that no inventive effort is involved, of which.

DETAILED DESCRIPTION

Figure 1:
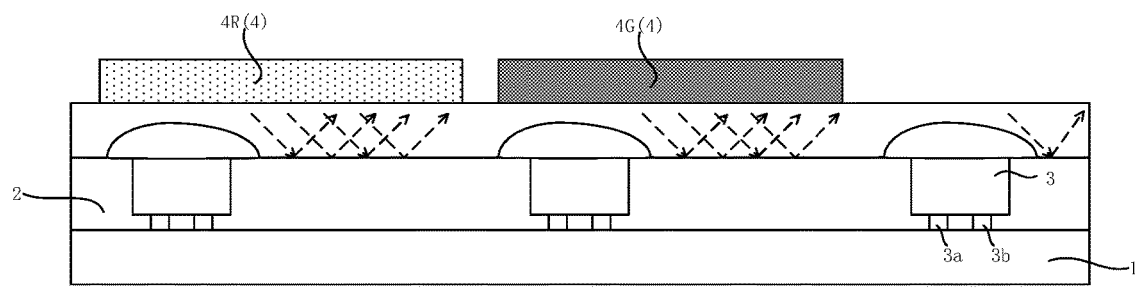
FIG. 1 is a cross-sectional structural view of a substrate according to some embodiments.

Below, a clear and complete description will be given for the technical solution of some embodiments of the present disclosure with reference to the figures of the embodiments. Obviously, the described embodiments are merely some embodiments of the present disclosure, rather than all embodiments thereof. All other embodiments obtained by those of ordinary skill in the art based on the embodiments of the present disclosure shall fall within the protection scope of the present disclosure.

Throughout the specification and the claims which follow, unless the context requires otherwise, the word "comprise", and variations such as "comprises" and "comprising", will be understood to imply open-ended inclusion, i.e., "comprising but not limited to". In the description of this specification, reference throughout this specification to "one embodiment", "some embodiments", "illustrative embodiments", "examples", "specific examples", or "some examples" means that a particular feature, structure, material or characteristic described in connection with the embodiment is included in at least one embodiment of the present disclosure. Therefore, illustrative references to the above terms are not necessarily all referring to the same embodiment or example. In addition, the described features, structures, materials, or characteristics may be combined in any suitable manner in one or more embodiments.

Below, the terms "first" and "second" are used for descriptive purposes only, and are not to be construed as indicating or implying relative importance or implicitly indicating the number of indicated technical features. Thereby, features defined by "first", "second" may expressly or implicitly comprise one or more of the features. In the description of the embodiments of the present disclosure, unless otherwise indicated, the phrase "a plurality of" means "two or more".

"At least one of A, B, and C" has the same meaning as "at least one of A, B, or C", and both include the following combinations of A, B, and C: A only, B only, C only; the combination of A and B; the combination of A and C; the combination of B and C; and the combination of A, B and C.

"A and/or B" includes the following three combinations: A only, B only, and the combination of A and B.

The use of "suitable for" or "configured to" means open-ended and inclusive language, which does not exclude devices suitable for or configured to perform additional tasks or steps.

In addition, the use of "based on" has an open-ended and inclusive meaning, because processes, steps, calculations or other actions "based on" one or more of the stated conditions or values may be based on additional conditions or values that are not stated in practice.

As used herein, "about" or "approximately" includes the stated value as well as an average value within an acceptable tolerance range of the specified value, wherein the acceptable tolerance range is determined by a person of ordinary skill in the art in consideration of the measurement in question and the error associated with the measurement of a specific quantity (i.e., the limitation of the measurement system).

Exemplary embodiments are described herein with reference to cross-sectional views and/or plan views as idealized exemplary drawings. In the drawings, the thickness of layers and regions is enlarged for clarity. Therefore, due to, for example, manufacturing technology and/or tolerances, changes in the shape with respect to the drawings are conceivable. Therefore, the exemplary embodiment should not be interpreted as being limited to the region shapes shown herein, but includes shape deviations caused by, for example, fabrication. For example, an etched region shown as a rectangle will usually have a curved feature. Therefore, the regions shown in the drawings are schematic in nature, and their shapes are not intended to show the actual shapes of the regions of the device, and are not intended to limit the scope of the exemplary embodiment.

The main object of this invention is to provide a composition, a substrate and a preparation method of a light reflection layer. It is used to solve the problem that curing shrinkage of a light reflection layer in the related technology may produce stress on the edge of a base substrate, resulting in large warpage of an edge of the base substrate, which is not conducive to subsequent adsorption and assembly.

According to some embodiments of the present disclosure, since a filler material can be filled between crosslinking points of any adjacent reactant molecules, by adding a filler material to a composition and controlling the addition amount of the filler material, the filler material can be filled between crosslinking points of some adjacent reactant molecules. In crosslinking the reactant molecules under a first preset condition, the number of connections in the cross-linking reaction between the reactant molecules can be reduced while ensuring adhesion and attachment of a light reflection film, so as to reduce stress caused by curing shrinkage of the light reflection film, thereby reducing warpage. Moreover, compared with not adding a filler material in the related art, the filler material can be also used for buffering, thereby reducing an increase in stress caused by the cross-linking of the reactant molecules.

Some embodiments of the present disclosure provide a light-emitting device, which includes a light-emitting substrate and, of course, other components. For example, it may include a circuit for providing an electrical signal to the light-emitting substrate to drive the light-emitting substrate to emit light. This circuit may be referred to as a control circuit. The light-emitting device may also include a circuit board and/or an IC (Integrated circuit) electrically connected to the light-emitting substrate.

In some embodiments, the light-emitting device may be an illumination device. In this case, the light-emitting device is used as a light source to realize the function of illumination. For example, the light-emitting device may be a backlight module in a liquid crystal display device, a lamp for indoor or outdoor lighting, or various signal lamps.

In other embodiments, the light-emitting device may be a display device. In this case, the light-emitting substrate is a display substrate for realizing the function of displaying images (i.e., pictures). The light-emitting device may include a display or a product comprising a display. The display can be a flat panel display (FPD), a micro display, etc. According to whether a user can see through the back of the display, the display can be a transparent display or an opaque display. According to whether the display can be bent or curled, the display can be a flexible display or an ordinary display (which can be called a rigid display). For example, products including a display may include: computer display, television, billboard, laser printer with display function, telephone, mobile phone, personal digital assistant (PDA), laptop computer, digital camera, portable camera, viewfinder, vehicle, large-area wall, theater screen or stadium sign, etc.

Some embodiments of the present disclosure provide a substrate, as shown in FIG. 1, including a base substrate 1 and a light reflection layer 2 disposed on the base substrate 1.

In some embodiments, the substrate may be a light-emitting substrate. In this case, the substrate further comprises a plurality of light-emitting elements 3 disposed at intervals on the base substrate 1 of the substrate. A light reflection layer is provided between any two adjacent light-emitting elements 3.

The light-emitting element 3 may be a micro inorganic light-emitting diode, and may be provided on the base substrate 1 through a transfer process and a binding process. It can be understood that each light-emitting element 3 has electrode pins 3a and 3b, and the light reflection layer is also located between the electrode pins 3a and 3b.

It can be understood that a surface of the light reflection layer away from the base substrate 1 may be flush with a surface of the light-emitting element 3 away from the base substrate 1, or a surface of the light reflection layer away from the base substrate 1 is lower than a surface of the light-emitting element 3 away from the base substrate 1, which is not limited herein.

Figure 2:
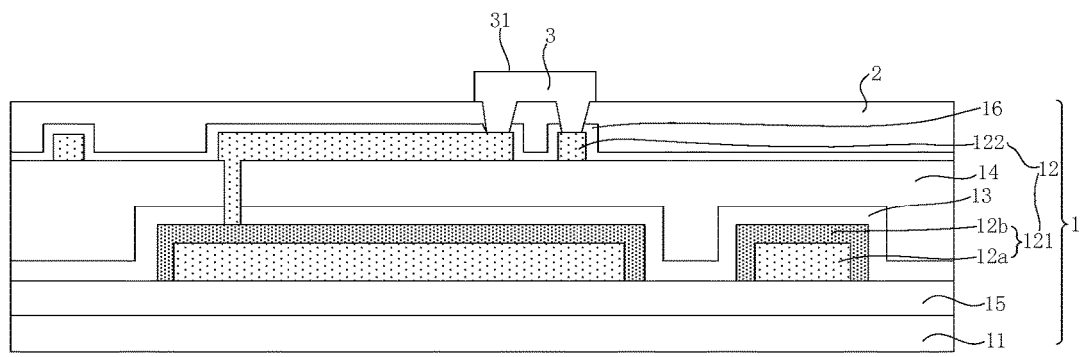
FIG. 2 is a cross-sectional structural view of a base substrate according to some embodiments.

For example, as shown in FIG. 2, the base substrate 1 may be a substrate 11 with a circuit layer 12 formed thereon. The circuit layer 12 may include a first metal wiring layer 121 and a second metal wiring layer 122 with a first passivation layer 13 and a planarizing layer 14 therebetween. The first metal wiring layer 121 may include a copper seed layer 12a and a copper growth layer 12b. The material of the first passivation layer 13 may be an inorganic material, such as silicon nitride, silicon oxide or silicon oxynitride. The material of the planarizing layer 14 may be an organic material, such as polyimide, epoxy resin, phenolic resin or other organic material. The first passivation layer 13 and the planarizing layer 14 are provided with via-holes for coupling the second metal wiring layer 122 to the first metal wiring layer 121.

In order to increase the stress between the first metal wiring layer 121 and the glass substrate 11, a buffer layer 15 may also be provided between the glass substrate 11 and the first metal wiring layer 121. The buffer layer 15 is made of an inorganic material such as silicon nitride or silicon oxide. The copper seed layer 12a in the first metal wiring layer 121 may include a first metal adhesive layer and a first copper metal layer, wherein the first metal adhesive layer can enhance the bonding force between the first copper metal layer and the buffer layer 15. The material of the first metal adhesion layer may be an alloy material containing molybdenum, such as molybdenum niobium alloy, molybdenum niobium copper alloy, etc. The first metal wiring layer 121 may also include a first metal protective layer located on a side of the copper growth layer 12b away from the glass substrate 11, which can prevent the surface of the copper growth layer 12b from being oxidized. The material of the first metal protective layer may be an alloy containing nickel, for example, a copper nickel alloy, etc.

In some embodiments, the second metal wiring layer 122 may include a second metal adhesive layer and a second copper metal layer, wherein the second metal adhesive layer may enhance the adhesion between the second copper metal layer and the planarizing layer. The material of the second metal adhesion layer may be an alloy material containing molybdenum, such as molybdenum niobium alloy, molybdenum niobium copper alloy, etc. The second metal wiring layer 122 may also include a second metal protective layer located on a side of the second copper metal layer away from the glass substrate 11, which can prevent the surface of the second copper metal layer from being oxidized. The material of the second metal protective layer may be an alloy containing copper, such as a copper nickel alloy or a copper titanium alloy.

In some embodiments, as shown in FIG. 2, the base substrate 1 may further include a second passivation layer 16 and an insulating protective layer (not shown in the figures) arranged on a side of the second metal wiring layer 122 away from the glass substrate 11. The second passivation layer 16 and the insulating protection layer may be provided with via-holes for connecting the light emitting element 3 and the second metal wiring layer 122. The material of the second passivation layer 16 may be an inorganic material, such as silicon nitride, silicon oxide or silicon oxynitride. The material of the insulating protective layer may be an inorganic-organic composite material. The light reflection layer 2 may be formed on the insulating protective layer.

In some embodiments, as shown in FIG. 1, each light emitting element 3 includes a light emitting surface 31. It further includes a light conversion layer 4 disposed on the substrate 1 and located on one side of the light emitting surface 31. The light conversion layer 4 is configured to receive light emitted from the light emitting surface 31 and emit the light after wavelength conversion. The light reflection layer 2 is configured to reflect the light emitted by the light conversion layer 4.

For example, the material of the light conversion layer 4 may be red green quantum dots or red green color films, etc. For example, the light-emitting element 3 may be a light-emitting diode that emit light in the blue wavelength band, the light conversion layer 4 may include a red quantum dot pattern 4R or a green quantum dot color film 4G. The light conversion layer 4 receives light in the blue wavelength band emitted by the light-emitting element 3 and converts it into light in the red or green wavelength band. In this embodiment, individual light-emitting elements 3 capable of emitting light in the blue wavelength band are used as self light-emitting devices. Some light-emitting elements 3, in conjunction with a light conversion layer, can realize red light output or green light output, and coordinate with other light-emitting elements that emit light in the blue wavelength band to form red, green and blue sub-pixels, so as to realize a display panel capable of displaying color pictures. The light-emitting element may be a micro inorganic light-emitting diode, such as a micro LED or a mini LED.

In other embodiments, light-emitting elements emitting light in the blue wavelength band are provided in an array on the base substrate 1. Through disposing a phosphor layer or quantum dot layer on the light emitting side of all light-emitting elements, a high brightness light source capable of emitting uniform white light is realized, which can be used with a liquid crystal panel to form a high contrast display device. Further, the base substrate is further provided with a driving circuit layer 12. The driving circuit layer can realize precise regional control of multiple light-emitting elements, so as to realize a million-level contrast display device, the high-brightness feature of which is incomparable to OLED (Organic Light-Emitting Diode) display panels in the same size.

Some embodiments of the present disclosure provide a composition, comprising: a matrix material and an additive, the matrix material including a solvent, reactant molecules X and a material with reflection function dispersed in the solvent, etc.

As the name suggests, a material with reflection function is a material that can play a light reflection role, which can be a liquid, solid or solid-liquid mixture, with a mass percentage in the composition from 30% to 60%.

In some embodiments, the material with reflection function is in the form of powder or microspheres.

For example, the material with reflection function can be titanium dioxide.

In order to play the role of reflection, the material with reflection function that is in the form of powder or microspheres has a relatively small particle diameter. For example, the particle diameter can be 4 microns~8 microns.

The additive mainly plays other auxiliary roles such as leveling and buffering, and its mass proportion in the composition may be 1%~10% as an example.

For example, the additive may include any one or more combinations of a leveling agent and a buffering agent. An example of the leveling agent may be isophorone or cyclohexanone, and an example of the buffering agent may be polydimethylsiloxane.

The reactant molecules X mainly play the role of adhesion, and the mass percentage of the reactant molecules X in the composition may be 15%~45%, for example. The solvent is mainly used for adjusting the change in viscosity, and its mass percentage in the composition may be 15%~45%, for example.

In some embodiments, the reactant molecules X may undergo a crosslinking reaction under a first preset condition, wherein the reactant molecules X include monomer molecules and/or prepolymer molecules. Crosslinking reaction refers to a reaction of two or more molecules (generally linear molecules) bonded and crosslinked into more stable molecules (body molecules) in a network structure. This reaction transforms linear or slightly branched macromolecules into a three-dimensional network structure, so as to achieve the function of adhesion.

According to the above content that the reactant molecules X include monomer molecules and/or prepolymer molecules, it can be known that the crosslinking reaction can be linking from monomer molecules or prepolymer molecules. The crosslinking reaction can be chemical crosslinking or physical crosslinking, which is not specifically limited herein. The reactant molecule X contains functional groups capable of undergoing cross-linking reaction, such as hydroxyl, carboxyl, amide, hydroxymethyl, etc. Each of the functional groups that is capable of undergoing crosslinking reaction can be regarded as a crosslinking point.

Here, the specific structure of reactant molecule X is not limited, and reactant molecule X can be any molecule that can produce adhesion between base substrate 1 and the material with reflection function through cross-linking reaction. The reactant molecule X may be selected from at least one of acrylic resin or epoxy resin. In this case, there are three possible examples.

Figure 3:
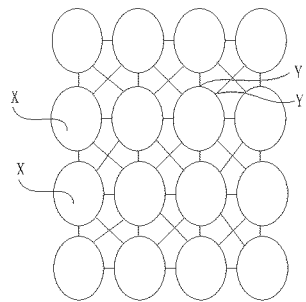
FIG. 3 is a structural diagram of one kind of cross-linking of reactant molecules provided by the related technology.

According to one example, as shown in FIG. 3, the reactant molecule X is acrylic resin (($C_3H_4O_2$)n, n is an integer greater than or equal to 2). Acrylic resin, the basic component of which is acrylic monomer (molecular formula: C3H4O2), is an insoluble and infusible prepolymer formed through cross-linking reaction. The molecular weight of the prepolymer is generally small, and its structure contains remaining functional groups. During a heating process, these functional groups can further react with each other or with active functional groups in other system resins, such as amino resin, epoxy resin, polyurethane, etc., and are cured to form a cross-linked network structure. ($C_3H_4O_2$) is the monomer structure of acrylic resin in a repeating unit of acrylic resin, wherein n represents the degree of polymerization, which means that the acrylic resin monomers are formed by the addition polymerization of their own carbon-carbon double bonds.

Figure 4:
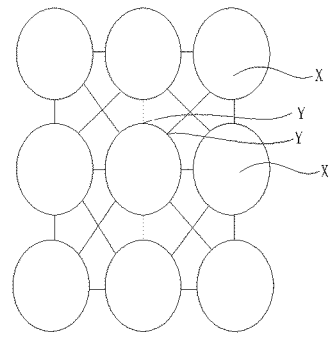
FIG. 4 is a structural diagram of another kind of cross-linking of reactant molecules provided by the related technology.

According to an example, as shown in FIG. 4, the reactant molecule X is epoxy resin (($C_{11}H_{12}O_3$)n). Epoxy resin is the general name of a class of polymers containing more than two epoxy groups in the molecule, which is the polycondensation product of epichlorohydrin and bisphenol A or polyol. Due to the chemical activity of epoxy group, by adding a curing agent, for example, a variety of compounds containing active hydrogen for ring opening, a network structure is generated through curing and crosslinking. ($C_{11}H_{12}O_3$) is a repeating unit in epoxy resin, wherein n represents the degree of polymerization.

According to one example, the reactant molecules X include acrylic resin and epoxy resin. Epoxy resin can be used as a curing agent to crosslink with acrylic resin.

In the above example provided by the present disclosure, in the process of preparing a light reflection layer 2 using the composition, the matrix material and the additive in the composition can be mixed to form a mixed liquid. The mixed liquid can be formed on the base substrate 1 through printing and other processes to form a prefabricated film. Herein, the prefabricated film can be a relatively thin liquid film or a relatively viscous colloidal film, which is not limited herein. After the formation of the prefabricated film, the reactant molecules X basically do not undergo chemical reaction, but are present a film shape in physical form. In this case, the reactant molecules X is capable of undergoing cross-linking reaction under a certain condition (such as heating or illumination). The prefabricated film shrinks due to the connection between the cross-linking points of reactant molecules X. Finally, a light reflection layer 2 can be formed by curing. In this process, the prefabricated film continues to shrink. During the curing shrinkage of the prefabricated film, stress will be generated on the edge of the base substrate 1, resulting in upward warpage of the edge of the base substrate 1. This warpage will reduce the reliability of the product, affect the subsequent process, and is not conducive to the subsequent assembly process, thereby resulting in the reduction of the yield of the product.

Figure 5:
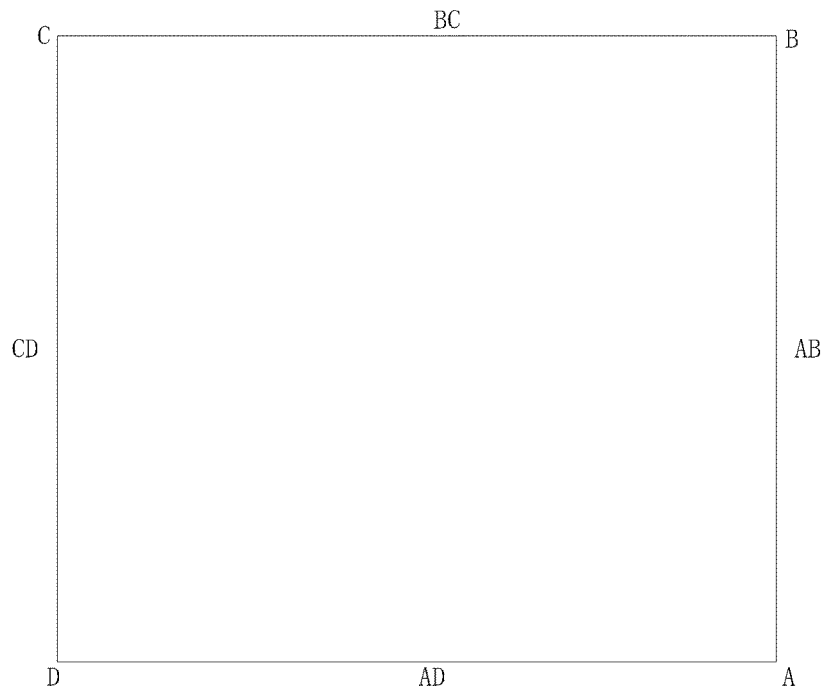
FIG. 5 is a top view of a base substrate according to some embodiments of the present disclosure.
Figure 6:
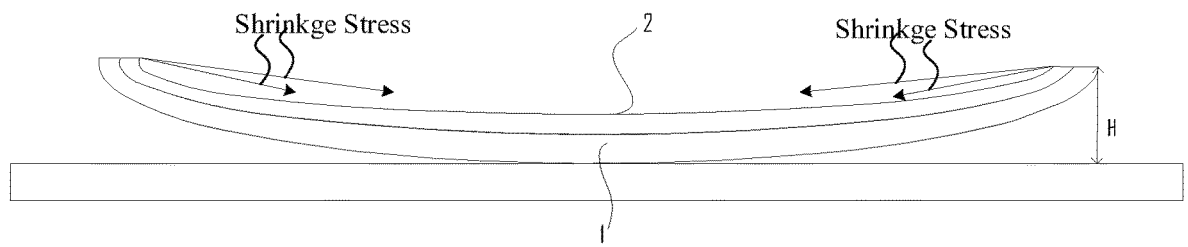
FIG. 6 is a side view showing edge warping of a base substrate provided by the related technology.

As shown in the top view of FIG. 5, taking a base substrate 1 with a rectangular main surface as an example, the four corners of the base substrate 1 are marked as A, B, C and D respectively, and the corresponding four edges are marked as AB, BC, CD and AD respectively. If the reactant molecules X are acrylic resin, after the formation of the light reflection layer 2, as shown in the top view of FIG. 6, the edge of the base substrate 1 warps upward under the stress of the light reflection layer 2, wherein the arrows indicate the stress caused by the curing shrinkage of the prefabricated film. After measurement, it is observed that the warpage values of corners A, B, C and D were about 10 mm~13 mm, and the warpage values of AB, BC, CD and AD were about 6 mm~9 mm, thereby showing a bowl-like warpage.

Figure 7:
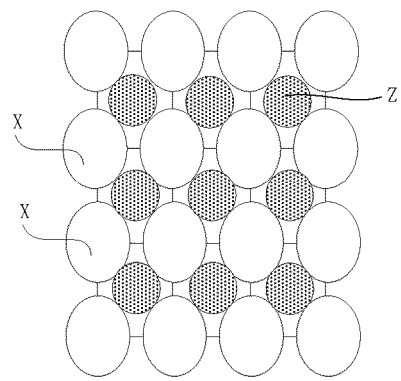
FIG. 7 is a structural diagram of cross-linking of reactant molecules after the addition of a filler material according to some embodiments of the present disclosure.
Figure 8:
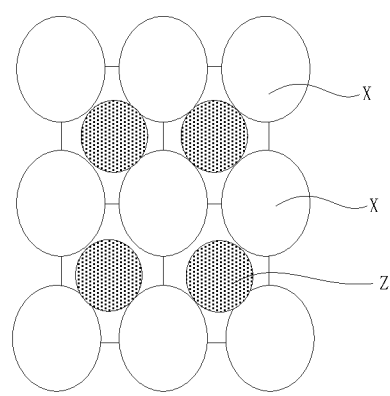
FIG. 8 is a structural diagram of cross-linking of reactant molecules after the addition of a filler material according to some other embodiments.

On this basis, in some embodiments, as shown in FIGS. 7 and 8, the additive also includes a filler material Z. The filler material Z is in the form of powder or microspheres, and can be dispersed in the matrix material to be filled between crosslinking points Y of any adjacent reactant molecules X, so as to block the crosslinking reaction of some adjacent reactant molecules X occurred under a first preset condition.

Powder refers to fine particles with a small particle size range. Powder usually refers to the aggregate of discrete particles with size less than 1 mm, which can be nano particles, micron particles, etc. Particles are geometric solids with specific shapes in a certain size range. Particles can be solid particles, mist droplets, oil droplets and other liquid particles.

Microspheres are tiny spheroids, which can be spherical or quasi spherical, and can be solid or hollow.

In these embodiments, since a filler material Z can be filled between crosslinking points Y of any adjacent reactant molecules X, through adding a filler material Z to the composition and controlling the addition amount of the filler material Z, the filler material can be filled between crosslinking points Y of some adjacent reactant molecules X. In crosslinking the reactant molecules X under a first preset condition, the number of connections in the crosslinking reaction between the reactant molecules X can be reduced while ensuring the adhesion and attachment of the light reflection film, so as to reduce the stress caused by the curing shrinkage of the light reflection film, thereby reducing warpage. Moreover, compared with not adding a filler material Z in the related art, the filler material Z can be also used for buffering, thereby reducing an increase in stress caused by the cross-linking of the reactant molecules.

During storage, the filler material Z can be directly dispersed in the matrix material or packaged separately for storage. When in use, the filler material Z can be added to the matrix material according to an addition proportion.

In the above first and second examples provided by the present disclosure, as shown in FIGS. 3 and 4, reactant molecules X are connected into a network structure through cross-linking points Y. FIGS. 3 and 4 show an example in which one reactant molecule X has six cross-linking points Y. It can be seen from FIGS. 3 and 4 that, for reactant molecules X with the same number of cross-linking points Y, the greater the molecular weight, the larger the volume it occupies, and the fewer the number of cross-linking points Y per unit area, so that the stress caused by the curing shrinkage of the light reflection film can be reduced, thereby reducing the shrinkage.

Therefore, compared with the case where the reactant molecule X is acrylic resin, when the mass of the reactant molecules X in the matrix material is constant and the reactant molecule X is epoxy resin, the connection between the reactant molecules X can be further reduced, so that the stress generated by the curing shrinkage of the light reflection film can be further reduced, thereby reducing the shrinkage. In addition, compared with the related technology in which no filler material Z is added and more reactant molecules X with smaller molecular weight have their cross-linking points Y connected to form the light reflection layer 2, by adding the filler material Z between the reactant molecules X with larger molecular weight, the gap between the reactant molecules X can also be filled to avoid a decrease in adhesion due to a decrease in the number of connected cross-linking points Y of the reactant molecules X with large molecular weight.

In some embodiments, in the case that the material with reflection function is in the form of powder or microspheres, the particle diameter of the filler material is smaller than the particle diameter of the material with reflection function. For example, the larger particle diameter of titanium dioxide is not conducive to blocking the cross-linking reaction between crosslinking points Y, while a filler material with a smaller particle diameter can block the crosslinking reaction between crosslinking points Y.

In some embodiments, the particle diameter of the filler material is 0.5 microns to 2 microns. It has been found that the light reflection layer 2 has the smallest value of warpage in this particle diameter range.

In some embodiments, the filler material Z may be selected from a mixture of one or more of silicon dioxide, silicate, titanium dioxide, metal oxide or hydroxide, calcium carbonate and cellulose.

For example, the filler material Z can be a mixed material of calcium silicate and metal oxide. In this case, according to the above filler material Z in the form of powder or microspheres, it can be known that the filler material Z can be a mixture of calcium carbonate powder and nano-metallic oxide materials. Alternatively, the filler material Z may be a mixture of cellulose microspheres and metal oxide microspheres.

In some embodiments, the filler material Z is calcium carbonate and/or aluminum hydroxide. These two materials are white and will not absorb the reflected light, so the reflection effect can be guaranteed.

In some embodiments, the mass percentage of the filler material Z in the composition is 0.1%~5%. That is, the mass percentage of the filler material Z in the composition can be any value from 0.1% to 5%. For example, it can be 0.2%, 0.3%, 0.4%, 0.5%, 0.6%, 0.7%, 0.80, 0.90, 1%, 1.1%, ..., 2%, 3%, ..., 5%, etc.

In this case, according to the fact that the additive includes the filler material Z, given a determined mass percentage of the additive in the composition, the mass percentage of the filler material Z in the composition is less than or equal to the mass percentage of the additive in the composition.

According to the above content, in addition to the filler material Z, the additive can also include other additive components, such as a leveling agent, a buffering agent, etc. It can be seen that, in some embodiments, given a determined mass percentage of the additive in the composition, the ratio of the mass of filler material Z to the mass of other additive components than the filler material in the additive is greater than or equal to 1:1 and less than or equal to 4:1.

For example, if the mass percentage of the additive in the composition is 1%, and the mass percentage of the filler material Z in the composition is 0.5%, the mass percentage of other additive components in the composition can be 0.5%. If the mass percentage of the filler material Z in the composition is 0.8%, the mass percentage of other additive components in the composition can be 0.2%; if the mass percentage of the filler material Z in the composition is 0.6%, the mass percentage of other additive components in the composition can be 0.4%. If the mass percentage of the additive in the composition is 5%, and the mass percentage of the filler material Z in the composition is 4%, the mass percentage of other additive components in the composition can be 1%. If the mass percentage of the filler material Z in the composition is 2.5%, the mass percentage of other additive components in the composition can be 2.5%. If the mass percentage of the filler material Z in the composition is 3%, the mass percentage of other additive components in the composition can be 2%. If the mass percentage of the additive in the composition is 10%, and the mass percentage of the filler material Z in the composition is 5%, the mass percentage of other additive components in the composition can be 5%. If the mass percentage of the filler material Z in the composition is 8%, the mass percentage of other additive components in the composition can be 2%. If the mass percentage of the filler material Z in the composition is 6%, the mass percentage of other additive components in the composition can be 4%.

An introduction of a composition has been given above. Taking this composition as an example, a preparation method of the light reflection layer 2 will be illustratively described below.

Figure 9:
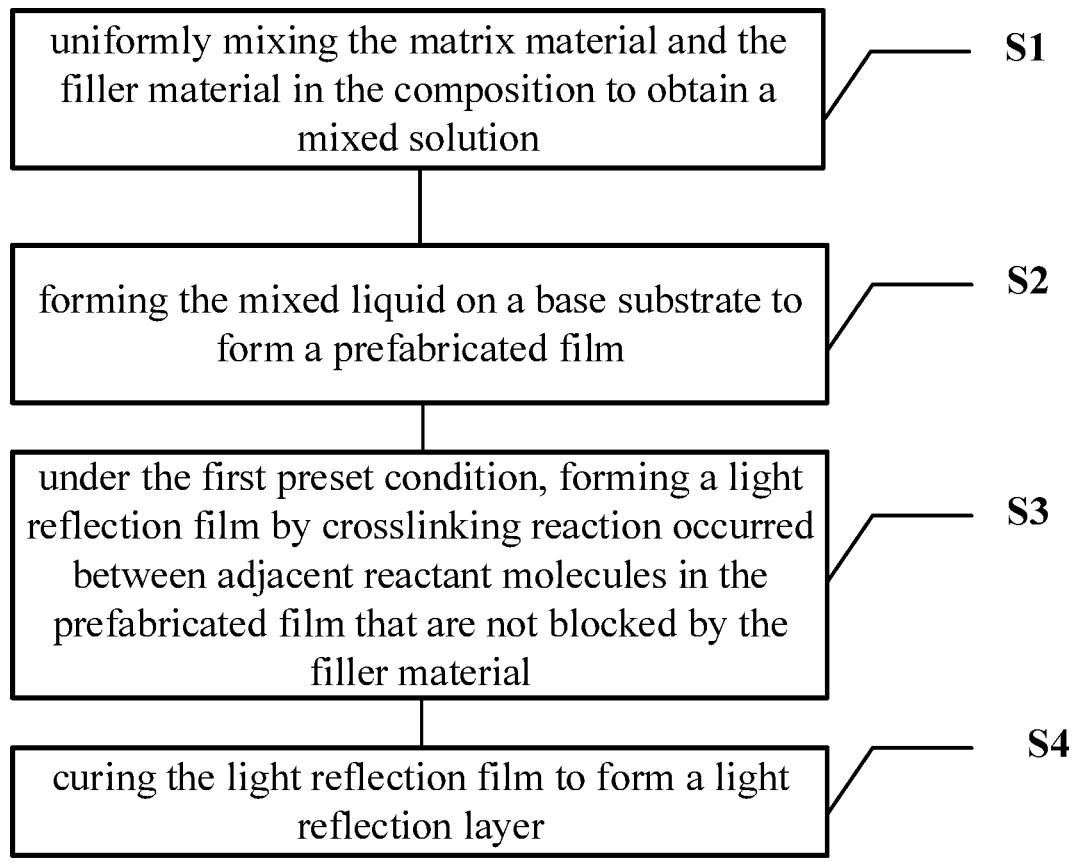
FIG. 9 is a schematic flowchart of a method for preparing a light reflection layer according to some embodiments of the present disclosure.

In some embodiments, a preparation method 900 of the above light reflection layer 2 will be described with reference to FIG. 9.

The method 900 comprises, at step S1, uniformly mixing the matrix material and the filler material Z in the composition to obtain a mixed solution.

The matrix material in the above composition includes a solvent, reactant molecules X and a material with reflection function dispersed in the solvent, wherein the filler material Z is in the form of powder or microspheres. It can be learned that the filler material Z can be added to and mixed with the matrix material through stirring.

In this case, in order to avoid cross-linking reaction between the matrix material and the filler material Z during mixing, uniformly mixing the matrix material and the filler material in the composition optionally comprises:

stirring the matrix material and the filler material for a preset time under a second preset condition to mix the matrix material and the filler material uniformly, wherein the second preset condition is different from the first preset condition.

For example, if the first preset condition is a light radiation condition, the second preset condition may be a condition of keeping in dark. If the first preset condition is a condition of heating to a preset temperature, the second preset condition may be room temperature.

In some embodiments, if the reactant molecule X is selected from at least one of acrylic resin or epoxy resin, the first preset condition may be a temperature condition from 120° C. to 150° C. In this case, the second preset condition can be a condition of keeping in dark and at a temperature of 20° C.~30° C. The mixing time can be 20 min 60 min.

The method further comprises, at step S2, forming the mixed liquid on a base substrate 1 to form a prefabricated film.

For example, the mixed liquid may be formed on the substrate 1 by a screen printing process or a spin coating process to form a prefabricated film.

Here, the prefabricated film can be a relatively thin liquid film or a relatively viscous colloidal film, which is not specifically limited herein. Upon the formation of the prefabricated film, the reactant molecules X basically do not undergo chemical reaction, but only present a film shape in physical form.

At step S3, the method comprises, under the first preset condition, forming a light reflection film by crosslinking reaction occurred between adjacent reactant molecules X in the prefabricated film that are not blocked by the filler material.

For example, taking reactant molecules X selected from at least one of acrylic resin or epoxy resin as an example, a cross-linking reaction can occur between adjacent reactant molecules X in the prefabricated film that are not blocked by the filler material at a temperature of 120° C.~150° C.

At step S4, the method comprises curing the light reflection film to form a light reflection layer 2.

After the crosslinking reaction is completed, the light reflection layer 2 can be formed by curing.

For example, still taking reactant molecules X selected from at least one of acrylic resin or epoxy resin as an example, after crosslinking, the light reflection film can be cured at a temperature of 120° C.~150° C. In this process, curing shrinkage still occurs in the light reflection film. However, compared with the related technology in which no filler material is added, the existence of the filler material Z can reduce the number of connections occurred during the crosslinking process, so as to reduce the stress caused by crosslinking and curing. In addition, the filler material Z can also used for buffering, thereby reducing a stress increase caused by the connection of the reactant molecules X.

In some embodiments, in the case that the number of crosslinking points Y of a single reactant molecule X, such as acrylic resin and epoxy resin, is the same, the number of crosslinking points Y per unit area of epoxy resin is less than the number of crosslinking points Y per unit area of acrylic resin. It can be seen that, given a determined mass of reactant molecules X, there are more connections in the crosslinking reaction of acrylic resin, and fewer connections in the crosslinking reaction of epoxy resin. Therefore, optionally, reactant molecule X is epoxy resin. Therefore, an increase in stress caused by the connections of the reactant molecules X can be further reduced.

Moreover, compared with the related technology in which filler material Z is not added, by adding the filler material Z, the filler material Z can be filled in the gap between the reactant molecules X, so as to avoid the problem of reduced adhesion caused by the reduction of the connections of the reactant molecules X.

The above is only a description of forming the light reflection layer 2 on the base substrate 1. Those skilled in the art can understand that, before forming the light reflection layer 2 on the base substrate 1, the method can also include: forming a light-emitting element 3 on the base substrate 1.

Examples

In order to objectively describe the technical effects of the embodiments provided in the present disclosure, the present disclosure will be exemplarily described in detail below with reference to the following comparative examples and experimental examples.

It should be noted that in all the following comparative and experimental examples, the material with reflection function is titanium dioxide. The specific components of the composition in each of the comparative and experimental examples are shown in Table 1 below.

TABLE 1

| Group | Titanium dioxide | Reactant molecule | Solvent | Leveling agent | Filler material | Buffering agent |
|---|---|---|---|---|---|---|
| Comparative example 1 | 30% (particle diameter 4 μm) | 20% $((C_3H_4O_2)_n$, n = 50) | 45% | 5% | / | / |
| Comparative example 2 | 60% (particle diameter 8 μm) | 15% $((C_3H_4O_2)_n$, n = 50) | 15% | 4% | / | 6% |

TABLE 1-continued

| Group | Titanium dioxide | Reactant molecule | Solvent | Leveling agent | Filler material | Buffering agent |
|---|---|---|---|---|---|---|
| Comparative example 3 | 45% (particle diameter 6 μm) | 24% (($C_3H_4O_2$) n, n = 50) | 30% | 1% | / | / |
| Experimental example 1 | 30% (particle diameter 4 μm) | 20% (($C_3H_4O_2$) n, n = 50) | 45% | 2.5% | 2.5% (calcium carbonate, particle diameter 2 μm) | / |
| Experimental example 2 | 60% (particle diameter 8 μm) | 15% (($C_3H_4O_2$) n, n = 50) | 15% | 1% | 6% (titanium dioxide, particle diameter 1 μm) | 3% |
| Experimental example 3 | 45% (particle diameter 6 μm) | 24% (($C_3H_4O_2$) n, n = 50) | 30% | 0.8% | 0.4% (aluminium oxide, particle diameter 0.5 μm) | / |
| Experimental example 4 | 30% (particle diameter 4 μm) | 24% (($C_3H_4O_2$) n and ($C_{11}H_{12}O_3$) n, n = 50) | 45% | 2.5% | 2.5% (calcium carbonate, particle diameter 2 μm) | / |
| Experimental example 5 | 30% (particle diameter 4 μm) | 20% (($C_{11}H_{12}O_3$) n, n = 50) | 45% | 2.5% | 2.5% (calcium carbonate, particle diameter 2 μm) | / |
| Experimental example 6 | 60% (particle diameter 8 μm) | 15% (($C_3H_4O_2$) n and ($C_{11}H_{12}O_3$) n, n = 50) | 15% | 1% | 6% (titanium dioxide, particle diameter 1 μm) | 3% |
| Experimental example 7 | 60% (particle diameter 8 μm) | 15% (($C_{11}H_{12}O_3$) n, n = 50) | 15% | 1% | 6% (titanium dioxide, particle diameter 1 μm) | 3% |
| Experimental example 8 | 45% (particle diameter 6 μm) | 24% (($C_3H_4O_2$) n and ($C_{11}H_{12}O_3$) n, n = 50) | 30% | 0.8% | 0.4% (aluminium oxide, particle diameter 0.5 μm) | / |
| Experimental example 9 | 45% (particle diameter 6 μm) | 24% (($C_{11}H_{12}O_3$) n, n = 50) | 30% | 0.8% | 0.4% (aluminium oxide, particle diameter 0.5 μm) | / |
| Experimental example 10 | 60% (particle diameter 6 μm) | 15% (($C_{11}H_{12}O_3$) n, n = 50) | 22% | 1.5% | 1.5% (calcium carbonate, particle diameter 1.5 μm) | / |
| Experimental example 11 | 49% (particle diameter 6 μm) | 30% (($C_{11}H_{12}O_3$) n, n = 50) | 22% | 3% | 5% (aluminium oxide, particle diameter 0.5 μm) | / |
| Experimental example 12 | 60% (particle diameter 6 μm) | 20% (($C_{11}H_{12}O_3$) n, n = 50) | 19% | 0.2% | 0.8% (aluminium oxide, particle diameter 1 μm) | / |

The light reflection layer is prepared by using the composition described above, and the specific steps are as follows:

In step 1), the matrix material and additive in the composition are stirred under a condition of keeping in dark and at a temperature of 20° C.~30° C. for 20 min~60 min to obtain a mixed solution.

In step 2), the mixed solution is formed on the base substrate 1 by screen printing.

In step 3), the reactant molecules are crosslinked at a temperature of 120° C.~150° C. and cured to obtain the light reflection layer 2.

The difference is that in comparative example 1 the temperature in step 1) is 20° C., the stirring time is 20 min, and the temperature in step 3 is 120° C.; in comparative example 2 the temperature in step 1) is 30° C., the stirring time is 60 min, and the temperature in step 3 is 150° C.; in comparative example 3 the temperature in step 1) is 24° C., the stirring time is 45 min, and the temperature in step 3 is 135° C. The reaction condition of experimental example 1 is the same as that of comparative example 1; the reaction condition of experimental example 2 is the same as that of comparative example 2; the reaction condition of experimental example 3 is the same as that of comparative example 3. The reaction condition of experimental examples 4 and 5 is the same as that of comparative example 1; the reaction condition of experimental examples 6 and 7 is the same as that of comparative example 2; the reaction condition of experimental examples 8 and 9 is the same as that of comparative example 3. The reaction condition of experimental example 10 is the same as that of comparative example 1; the reaction condition of experimental example 11 is the same as that of comparative example 2; the reaction condition of experimental example 12 is the same as that of comparative example 3.

The reflectivity, film adhesion, hardness and warpage of the light reflection layer obtained in the above comparative examples 1~3 and experimental examples 1~12 are measured. The measurement results are shown in Table 2 below.

TABLE 2

| Group | Reflectivity | Adhesion (B) | Hardness (H) | Warpage (mm) | Overflow (mm) |
|---|---|---|---|---|---|
| Comparative example 1 | 90 | 2 | 1 | 11-13 | 0.3~0.4 |
| Comparative example 2 | 94 | 4 | 4 | 11-13 | 0.3~0.4 |

TABLE 2-continued

| Group | Reflectivity | Adhesion (B) | Hardness (H) | Warpage (mm) | Overflow (mm) |
|---|---|---|---|---|---|
| Comparative example 3 | 92 | 3 | 2 | 11-13 | 0.1~0.2 |
| Experimental example 1 | 90 | 2 | 1 | 2-3 | 0.15~0.25 |
| Experimental example 2 | 94 | 4 | 4 | 1-2 | 0.1~0.2 |
| Experimental example 3 | 92 | 3 | 2 | 2-3 | 0.1~0.15 |
| Experimental example 4 | 90 | 2 | 1 | 1-2 | 0.15~0.25 |
| Experimental example 5 | 92 | 2 | 1 | 0.5-1 | 0.15~0.25 |
| Experimental example 6 | 92 | 4 | 4 | ≤0.5 | 0.1~0.2 |
| Experimental example 7 | 92 | 4 | 4 | ≤0.5 | 0.1~0.2 |
| Experimental example 8 | 90 | 3 | 2 | 2~3 | 0.1~0.15 |
| Experimental example 9 | 92 | 3 | 2 | 0.5-1 | 0.1~0.15 |
| Experimental example 10 | 94 | 2 | 1 | ≤0.5 | 0.2~0.3 |
| Experimental example 11 | 92 | 4 | 4 | ≤0.5 | 0.35~0.45 |
| Experimental example 12 | 94 | 3 | 2 | 0.5-1 | ≤0.1 |

The above reflectivity is the reflectivity of the light reflection layer measured at the wavelength of 450 nm.

The above adhesion measurement is a result obtained by cutting with a cross-cut tester and sticking with a 3M adhesive tape, calculating the area of detached flakes of the lattice, and comparing the detached area.

The above hardness measurement is to scratch on a test piece with a pencil at an angle of 45°, specifically, scratch about 1 CM in front of the tester at a uniform speed without breaking the lead core. The scratching speed is 1 cm/s. When evaluating the damage of the coating film by observing the damage of the coating film, if the substrate or primer coating film is visible in only 2 or less of the 5 tests, the same test should be carried out with a pencil with a hardness one level higher; if the film is damaged for more than 2 times (every 5 tests), a current hardness level of the pencil can be read, and a next hardness level is recorded.

The above warpage is measured as follows: take a base substrate with a light reflection layer formed thereon, the four corners of which are labeled as A, B, C and D respectively, measure the distance h between each of the four corners and a plane where the center of the base substrate is located, and calculate an average of the distances to obtain the warpage.

It can be seen from Table 2 that by adding a filler material to the matrix material and controlling the amount of filler material, the warpage caused by the curing shrinkage of the light reflection layer can be reduced. Compared with the related technology in which no filler material is added, the warpage is reduced from 11~13 mm to 2~3 mm. By selecting the reactant molecules in the matrix material and reducing the number of intermolecular connections, the warpage can be further reduced to a minimum warpage less than 0.5 mm. Moreover, due to the filling of the filler material, the problem of reduced adhesion caused by reduced intermolecular connections can also be avoided. It is found that the adhesion and hardness of the light reflection layer obtained after the change of the reactant molecules can meet the application requirements. Moreover, through testing the reflectivity of the light reflection layer obtained in each of the comparative and experimental examples, the reflectivity of the light reflection layer is greater than or equal to 90% in all cases, which shows that by adding an appropriate amount of filler material, the warpage can be reduced without affecting the reflectivity of the light reflection layer. Therefore, the light reflection layer of the present disclosure has good application value.

The disclosed above are only several specific embodiments of the present disclosure, however, the present disclosure is not limited to this. Any variation or replacement easily conceivable by those skilled in the art within the technical scope disclosed in the present disclosure shall fall within the protection scope of the present disclosure. Therefore, the protection scope of the present disclosure shall be determined by the terms of the claims.

What is claimed is:

1. A composition, comprising:
   a matrix material including a solvent, reactant molecules and a material with reflection function dispersed in the solvent, wherein the reactant molecules is capable of undergoing cross-linking reaction under a first preset condition, and include monomer molecules and/or pre-polymer molecules; and
   an additive including a filler material that is in the form of powder or microspheres, capable of being dispersed in the matrix material, and filled between the crosslinking points of any adjacent reactant molecules to block the crosslinking reaction of some adjacent reactant molecules under the first preset condition; wherein:
   the material with reflection function is in the form of powder or microspheres;
   a particle diameter of the filler material is smaller than a particle diameter of the material with reflection function, wherein the particle diameter of the filler material is 0.5 μm~2 μm;
   the filler material is selected from a mixture of one or more materials selected from a group consisting of silicon dioxide, silicate, metal oxide, titanium dioxide, calcium carbonate, and cellulose, and a mass ratio of the filler material in the composition is 0.1%~5%.

2. The composition according to claim 1, wherein the reactant molecule is selected from at least one of acrylic resin or epoxy resin.

3. The composition according to claim 2, wherein the reactant molecule is selected from epoxy resin.

4. The composition according to claim 1, wherein the particle diameter of the material with reflection function is 4 μm~8 μm.

5. The composition according to claim 1, wherein given a determined mass percentage of the additive in the composition, the ratio of the mass of the filler material to the mass of additive components in the additive other than the filler material is greater than or equal to 1:1 and less than or equal to 4:1.

6. The composition according to claim 1, wherein the mass ratio of the additive in the composition is 1%~10%.

7. A method for preparing a light reflection layer, comprising:
uniformly mixing the matrix material and the filler material in the composition according to claim 1 to obtain a mixed solution;
forming a prefabricated film by forming the mixed liquid on a base substrate;
under the first preset condition, forming a light reflection film by crosslinking reaction occurred between adjacent reactant molecules in the prefabricated film that are not blocked by the filler material;
curing the light reflection film to form a light reflection layer; wherein:
the material with reflection function is in the form of powder or microspheres;
a particle diameter of the filler material is smaller than a particle diameter of the material with reflection function, wherein the particle diameter of the filler material is 0.5 μm~2 μm;
the filler material is selected from a mixture of one or more materials selected from a group consisting of silicon dioxide, silicate, metal oxide, titanium dioxide, calcium carbonate, and cellulose, and a mass ratio of the filler material in the composition is 0.1%~5%.

8. The method for preparing a light reflection layer according to claim 7, wherein uniformly mixing the matrix material and the filler material in the composition comprises:
stirring the matrix material and the filler material for a preset time under a second preset condition to mix the matrix material and the filler material uniformly, wherein the second preset condition is different from the first preset condition.

9. A substrate, wherein the substrate is prepared by the method for preparing a light reflection layer according to claim 7.

10. The substrate according to claim 9, wherein the substrate further comprises a plurality of light-emitting elements arranged at intervals on the base substrate of the substrate;
the light reflection layer is formed between any two adjacent light-emitting elements of the plurality of light-emitting elements.

11. The substrate according to claim 9, wherein
each light-emitting element of the plurality of light-emitting elements includes a light-emitting surface;
the substrate further comprises a light conversion layer arranged over the base substrate and located on one side of the light-emitting surface;
the light conversion layer is configured to receive light emitted from the light-emitting surface and emit the light after performing wavelength conversion on the light emitted from the light-emitting surface, and the light-reflecting layer is configured to reflect the light emitted by the light conversion layer.

12. The substrate according to claim 10, wherein
each light-emitting element of the plurality of light-emitting elements includes a light-emitting surface;
the substrate further comprises a light conversion layer arranged over the base substrate and located on one side of the light-emitting surface;
the light conversion layer is configured to receive light emitted from the light-emitting surface and emit light after performing wavelength conversion on the light emitted from the light-emitting surface, and the light-reflecting layer is configured to reflect the light emitted by the light conversion layer.

* * * * *